United States Patent
Park et al.

(10) Patent No.: US 9,706,641 B1
(45) Date of Patent: Jul. 11, 2017

(54) MULTILAYER CAPACITOR AND BOARD HAVING THE SAME

(71) Applicant: SAMSUNG ELECTRO-MECHANICS CO., LTD., Suwon-si, Gyeonggi-do (KR)

(72) Inventors: Heung Kil Park, Suwon-si (KR); Jong Hwan Park, Suwon-si (KR); Young Ghyu Ahn, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/285,115

(22) Filed: Oct. 4, 2016

(30) Foreign Application Priority Data

Mar. 22, 2016 (KR) .................. 10-2016-0033807

(51) Int. Cl.
| | |
|---|---|
| *H01G 4/005* | (2006.01) |
| *H05K 1/02* | (2006.01) |
| *H05K 1/18* | (2006.01) |
| *H05K 1/11* | (2006.01) |
| *H01G 4/30* | (2006.01) |
| *H01G 4/236* | (2006.01) |
| *H01G 4/12* | (2006.01) |
| *H01G 4/248* | (2006.01) |

(52) U.S. Cl.
CPC .......... *H05K 1/0243* (2013.01); *H01G 4/005* (2013.01); *H01G 4/12* (2013.01); *H01G 4/236* (2013.01); *H01G 4/248* (2013.01); *H01G 4/30* (2013.01); *H05K 1/111* (2013.01); *H05K 1/181* (2013.01); *H05K 2201/10015* (2013.01)

(58) Field of Classification Search
CPC H01G 4/05; H01G 4/12; H01G 4/236; H01G 4/248; H01G 4/30; H01G 4/1209; H01G 4/232
See application file for complete search history.

(56) References Cited

U.S. PATENT DOCUMENTS

| | | | | |
|---|---|---|---|---|
| 2004/0125540 A1* | 7/2004 | Vieweg | .................. | H01G 4/385 361/306.3 |
| 2004/0257748 A1* | 12/2004 | Ritter | ..................... | H01G 4/012 361/306.3 |
| 2007/0019365 A1* | 1/2007 | Roy | ........................ | H01G 4/012 361/303 |

(Continued)

FOREIGN PATENT DOCUMENTS

| | | |
|---|---|---|
| JP | 8-162357 A | 6/1996 |
| JP | 2008-181956 A | 8/2008 |

(Continued)

OTHER PUBLICATIONS

Office Action Korean Patent Application No. 10-2016-0033807 dated Apr. 11, 2017 with full English translation.

*Primary Examiner* — Hoa C Nguyen
(74) *Attorney, Agent, or Firm* — McDermott Will & Emery LLP

(57) ABSTRACT

A multilayer capacitor includes internal electrodes having a plurality of lead portions exposed in a width direction of a body, and external electrodes connected to the lead portions, the external electrodes including a conducting layer, conductive resin layers, and a plating layer, respectively, and a board having the same.

11 Claims, 5 Drawing Sheets

(56) References Cited

U.S. PATENT DOCUMENTS

| | | | | |
|---|---|---|---|---|
| 2007/0121275 A1* | 5/2007 | Takashima | ............ | H01G 4/385 361/311 |
| 2008/0106847 A1* | 5/2008 | Ota | ............ | H01G 4/012 361/306.3 |
| 2009/0103237 A1* | 4/2009 | Nagamiya | ............ | H01G 4/12 361/321.2 |
| 2010/0188799 A1* | 7/2010 | Galvagni | ............ | H01G 4/012 361/306.3 |
| 2011/0007449 A1 | 1/2011 | Seo et al. | | |
| 2011/0317328 A1* | 12/2011 | Taniguchi | ............ | H01G 4/005 361/321.1 |
| 2012/0134067 A1 | 5/2012 | Si et al. | | |
| 2015/0014037 A1* | 1/2015 | Ahn | ............ | H01G 4/30 174/260 |
| 2016/0233029 A1* | 8/2016 | Oh | ............ | H01G 4/30 |

FOREIGN PATENT DOCUMENTS

| | | |
|---|---|---|
| JP | 2009-027101 A | 2/2009 |
| KR | 10-2006-0068404 A | 6/2006 |
| KR | 10-2011-0005072 A | 1/2011 |
| KR | 10-2012-0056548 A | 6/2012 |
| KR | 10-2014-0038872 A | 3/2014 |

* cited by examiner

MULTILAYER CAPACITOR AND BOARD HAVING THE SAME

CROSS-REFERENCE TO RELATED APPLICATION(S)

This application claims the benefit of priority to Korean Patent Application No. 10-2016-0033807, filed on Mar. 22, 2016 in the Korean Intellectual Property Office, the entirety of which is incorporated herein by reference.

TECHNICAL FIELD

The present disclosure relates to a multilayer capacitor and a board having the same.

BACKGROUND

Multilayer capacitors having low equivalent series inductance (ESL) characteristics are commonly used in the power supply circuits of highly integrated microprocessors. Such multilayer capacitors supply high frequency power to such microprocessors and suppress variations in a power supply voltage to allow the microprocessors to operate in a stable environment.

Recently, in accordance with an increase in the capacitance of electronic products, in general, multilayer capacitors used in many electronic products have also been required to have high capacitance.

In order to increase the capacitance of a multilayer capacitor, the number of stacked internal electrodes must be increased. When the number of stacked internal electrodes is increased, dielectric layers are thinned and the number of dielectric layers is increased, in order to allow for an increase in the number of stacked internal electrodes, while allowing for the miniaturization of the electronic products. This may lead to an increase in the occurrence rate of structural defects in the capacitor body, such that the reliability of the product may be decreased, which, in turn, causes a limitation in increasing the capacitance of the multilayer capacitor.

SUMMARY

An aspect of the present disclosure provides a multilayer capacitor having low equivalent series inductance (ESL) characteristics, a low occurrence rate of structural defects in a process of manufacturing a multilayer ceramic capacitor (MLCC), and high reliability, and aboard having the same.

An aspect of the present disclosure provides a multilayer capacitor in which internal electrodes have a plurality of lead portions exposed in a width direction of a body and external electrodes connected to the lead portions, and includes a conducting layer, conductive resin layers, and a plating layer, respectively, and a board having the same.

BRIEF DESCRIPTION OF THE DRAWINGS

The above and other aspects, features, and advantages of the present disclosure will be more clearly understood from the following detailed description, taken in conjunction with the accompanying drawings, in which.

DETAILED DESCRIPTION

Figure 1:
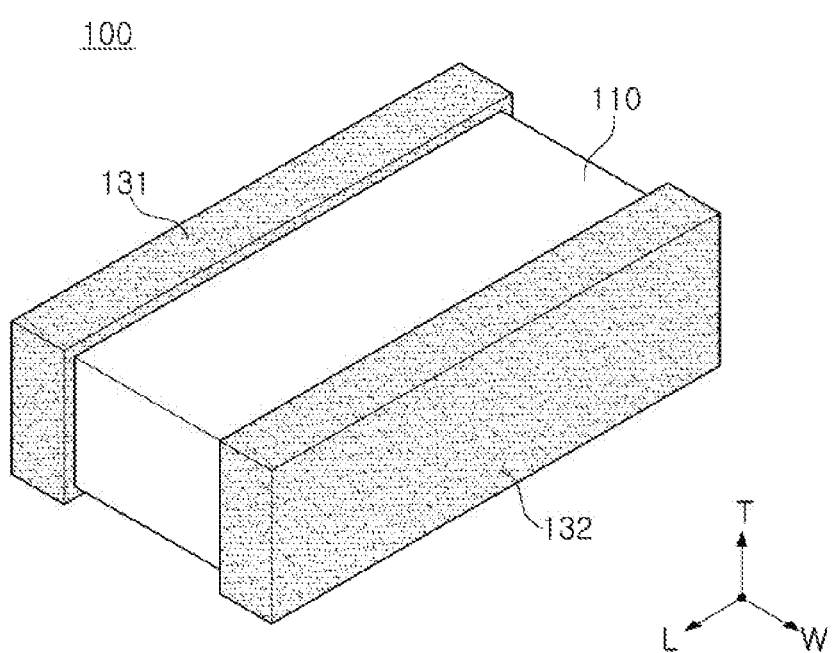
FIG. 1 is a perspective view schematically illustrating a multilayer capacitor, according to an exemplary embodiment in the present disclosure.
Figure 2:
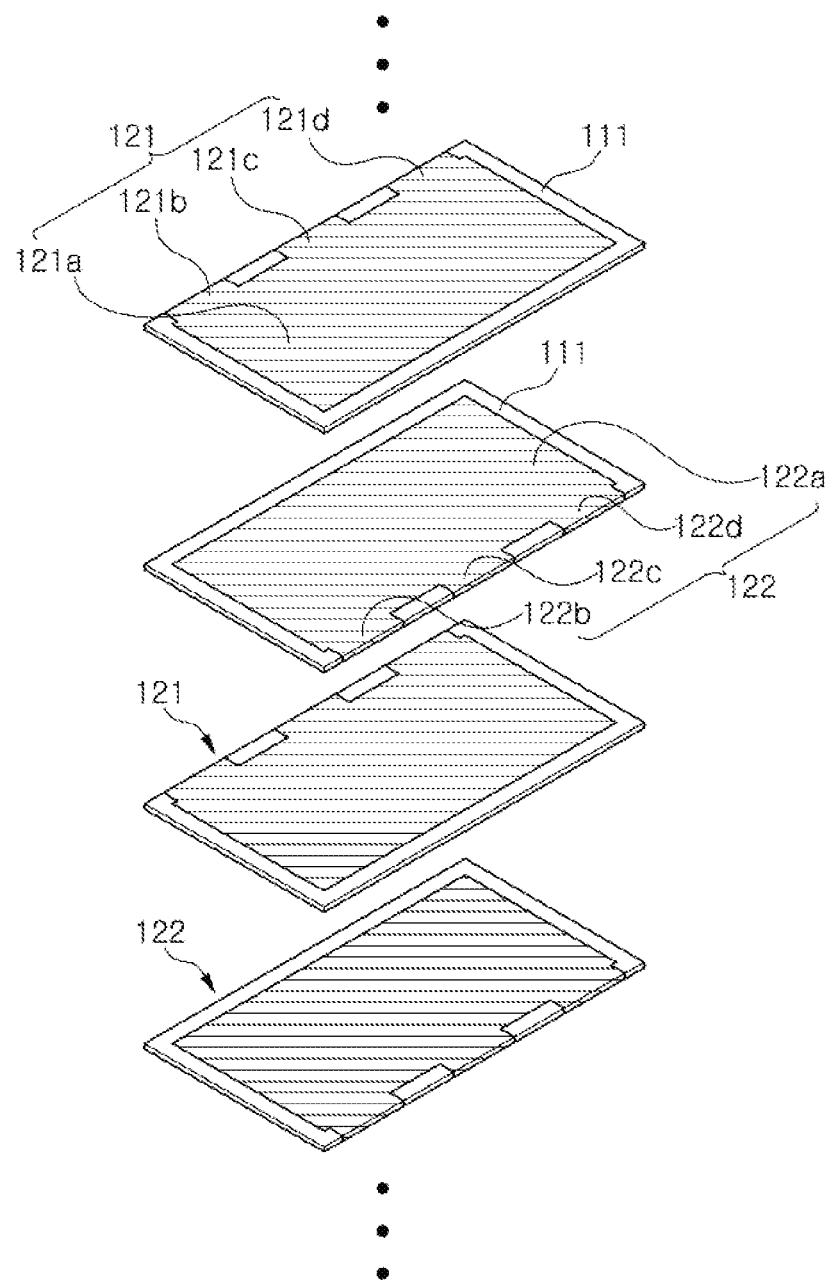
FIG. 2 is an exploded perspective view illustrating a stack structure of internal electrodes in FIG. 1.
Figure 3:
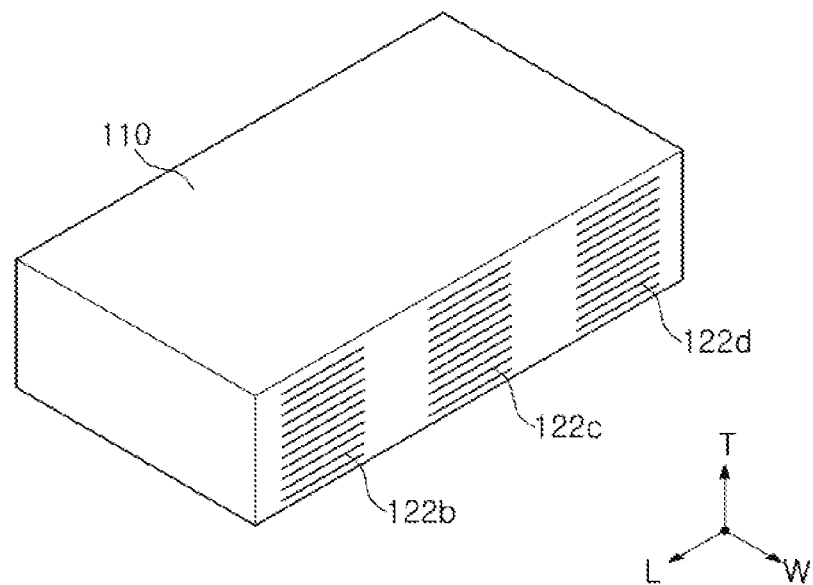
FIG. 3 is a perspective view illustrating a body in FIG. 1.
Figure 4:
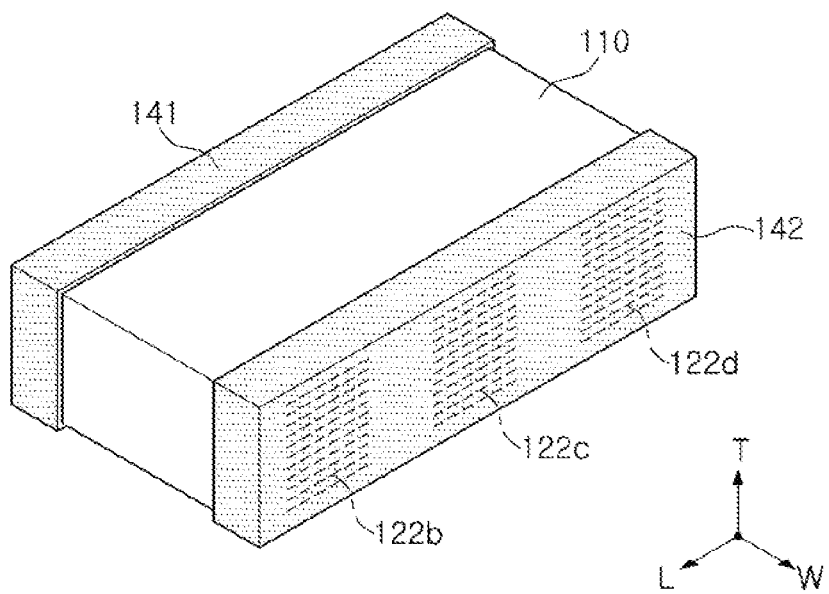
FIG. 4 is a perspective view illustrating additional conducting layers formed on the body of FIG. 1.
Figure 5:
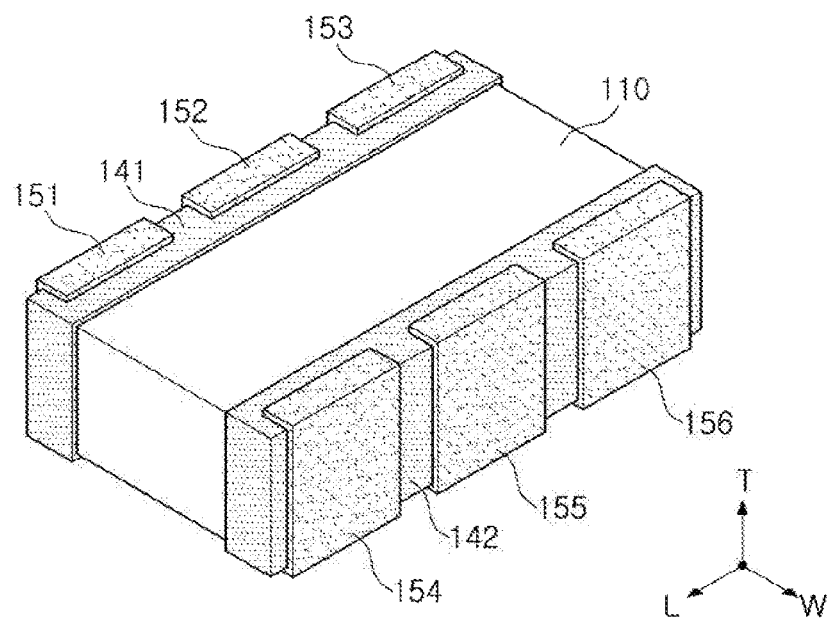
FIG. 5 is a perspective view illustrating additional conductive resin layers formed in FIG. 4.

Hereinafter, exemplary embodiments of the present disclosure will be described in detail with reference to the accompanying drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Terms with respect to directions of a hexahedron will be defined in order to allow exemplary embodiments in the present disclosure to be clearly described. L, W and T, illustrated in FIG. 1, refer to a length direction, a width direction, and a thickness direction, respectively. Here, the thickness direction may be the same as a stacking direction in which dielectric layers are stacked.

Multilayer Capacitor

FIG. 1 is a perspective view schematically illustrating a multilayer capacitor, according to an exemplary embodiment in the present disclosure.

Referring to FIGS. 1 through 5, a multilayer capacitor 100, according to the present exemplary embodiment, may include a body 110 and first and second external electrodes.

The body 110 may have first and second surfaces opposing each other in a thickness direction, third and fourth surfaces connecting the first and second surfaces to each other and opposing each other in a length direction, and fifth and sixth surfaces connecting the first and second surfaces to each other and opposing each other in a width direction.

Hereinafter, in the present exemplary embodiment, a description will be provided taking a case in which a mounted surface of the multilayer capacitor 100 is the first surface (a lower surface of FIG. 1) of the body 110 as an example.

The body 110 may be manufactured by stacking a plurality of dielectric layers 111 as well as a plurality of first and second internal electrodes 121 and 122, alternately disposed with at least one of the dielectric layers 111 interposed therebetween in the thickness direction, and sintering the plurality of dielectric layers 111 and the plurality of first and second internal electrodes 121 and 122.

The plurality of dielectric layers 111 may be stacked in the thickness direction and may be in a sintered state, and adjacent dielectric layers 111 may be integrated with each other so that boundaries therebetween may not be readily apparent without the use of a scanning electron microscope (SEM).

In addition, the dielectric layer 111, a ferroelectric layer, may contain a ceramic powder having a high-k, for example, at least one of a barium titanate ($BaTiO_3$)-based powder, a strontium titanate ($SrTiO_3$)-based powder, or a $CaCu_3Ti_4O_{12}$-based powder. However, a material of the dielectric layer 111 is not limited thereto, as long as a sufficient capacitance may be obtained thereby.

In addition, the dielectric layer 111 may further contain ceramic additives, organic solvents, plasticizers, binders, dispersants, and the like, if necessary, in addition to the ceramic powders.

The first and second internal electrodes 121 and 122 may be electrodes to which electricity having different polarities are applied, and may be disposed to be alternately exposed to the fifth and sixth surfaces of the body 111 in the width direction, with respective dielectric layers 111 interposed therebetween.

Here, the first and second internal electrodes 121 and 122 may be electrically insulated from each other by the dielectric layer 111 disposed therebetween.

In addition, a material forming the first and second internal electrodes 121 and 122 is not particularly limited, but may be a conductive paste formed of at least one selected from the group consisting of silver (Ag), copper (Cu), nickel (Ni), tin (Sn), indium tin oxide (ITO), palladium (Pd), a silver-palladium (Ag—Pd) alloy, or the like.

A method of printing the conductive paste may be a screen printing method, a gravure printing method, or the like, but is not limited thereto.

The first internal electrode 121 may include a first body portion 121a and a plurality of first lead portions 121b, 121c, and 121d, exposed from the first body portion 121a to the fifth surface of the body 110, and disposed to be spaced apart from each other in the length direction of the body 110.

The second internal electrode 122 may include a second body portion 122a overlapped with the first body portion 121a in a vertical direction to implement capacitance, and a plurality of second lead portions 122b, 122c, and 122d, exposed from the second body portion 122a to the sixth surface of the body 110, and disposed to be spaced apart from each other in the length direction of the body 110.

In the related art, when a degree of close adhesion or density of the external electrodes is insufficient, a plating solution or moisture may permeate into the body through the lead portions during a plating process to cause insulation resistance.

However, in the present exemplary embodiment, margins may be formed between the first lead portions 121b, 121c, and 121d, and the second lead portions 122b, 122c, and 122d, to prevent a decrease in reliability generated due to permeation of the plating solution or moisture into the body 110.

In addition, when the first and second internal electrodes 121 and 122 are exposed in the width direction of the body 110 as described above, a current path of the multilayer capacitor 100 may be shortened to decrease equivalent series inductance (ESL).

The first external electrode may include a first conducting layer 141, a plurality of first conductive resin layers 151 to 153, and a first plating layer 131.

The first conducting layer 141 may be formed on the fifth surface of the body 110 to cover all of the plurality of first lead portions 121b, 121c, and 121d.

Here, the first conducting layer 141 may extend to portions of the first and second surfaces of the body 110 in the thickness direction.

The first conductive resin layers 151 to 153 may be formed on the first conducting layer 141 to correspond to the first lead portions 121b, 121c, and 121d, respectively.

Here, the first conductive resin layers 151 to 153 may further extend to cover portions of the first conducting layer 141, and may extend to one or both surfaces of the body 110 in the thickness direction.

In addition, widths of the first conductive resin layers 151 to 153 may be greater than those of the first lead portions 121b, 121c, and 121d.

The first conductive resin layers 151 to 153 may contain a thermosetting resin and a metal. Here, the thermosetting resin may be, for example, an epoxy resin or a phenol resin, and the metal may be copper (Cu) or silver (Ag). However, the thermosetting resin and the metal are not limited thereto.

The first plating layer 131 may be formed on the first conducting layer 141 to cover all of the plurality of first conductive resin layers 151 to 153.

Here, the first plating layer 131 may further extend to cover the first conducting layer 141, and may extend to one or both surfaces of the body 110 in the thickness direction to cover all of the plurality of first conductive resin layers 151 to 153.

In addition, the first plating layer 131 may include a first nickel (Ni) plating layer formed on the first conducting layer 141 and a first tin (Sn) plating layer formed on the first nickel (Ni) plating layer.

The second external electrode may be an electrode to which electricity having a polarity different from the polarity of electricity applied to the first external electrode is applied, and may include a second conducting layer 142, a plurality of second conductive resin layers 154 to 156, and a second plating layer 132.

The second conducting layer 142 may be formed on the sixth surface of the body 110 to cover all of the plurality of second lead portions 122b, 122c, and 122d.

Here, the second conducting layer 142 may extend to portions of the first and second surfaces of the body 110 in the thickness direction.

The second conductive resin layers 154 to 156 may be formed on the second conducting layer 142 to correspond to the second lead portions 122b, 122c, and 122d, respectively.

Here, the second conductive resin layers 154 to 156 may further extend to cover portions of the second conducting layer 142, and may extend onto one or both surfaces of the body 110 in the thickness direction.

In addition, the widths of the second conductive resin layers 154 to 156 may be greater than those of the second lead portions 122b, 122c, and 122d.

Further, the second conductive resin layers 154 to 156 may contain a thermosetting resin and a metal. Here, the thermosetting resin may be, for example, an epoxy resin or a phenol resin, and the metal may be copper (Cu) or silver (Ag). However, the thermosetting resin and the metal are not limited thereto.

The second plating layer 132 may be formed on the second conducting layer 142 to cover all of the plurality of second conductive resin layers 154 to 156.

Here, the second plating layer 132 may further extend to the portions of the second conducting layer 142 and may extend to one or both surfaces of the body 110 in the thickness direction to cover all of the plurality of second conductive resin layers 154 to 156.

In addition, the second plating layer 132 may include a second nickel (Ni) plating layer formed on the second conducting layer 142 and a second tin (Sn) plating layer formed on the second nickel (Ni) plating layer.

In the present exemplary embodiment, the first and second plating layers 131 and 132 may be formed on the first and second conducting layers 141 and 142 and the first and second conductive resin layers 151 to 156, such that the first and second conducting layers 141 and 142 and the first and second conductive resin layers 151 to 156 may be bonded to each other by the first and second plating layers 131 and 132, respectively.

Therefore, the influence of contact resistance between the first and second conducting layers 141 and 142 and the first and second conductive resin layers 151 to 156 may be decreased to suppress an increase in equivalent series resistance (ESR).

In addition, due to the structure described above, noise may be removed, and reductions in reliability due to heat caused by a ripple current may be prevented.

In addition, mechanical stress may be absorbed by the elasticity of the first and second conductive resin layers 151 to 156 to prevent the occurrence of defects such as cracks, or the like.

According to the present exemplary embodiment, the internal electrodes may have the plurality of lead portions exposed in the width direction of the body, and the external electrodes connected to the lead portions may have a triple-layer structure of the conducting layer, the conductive resin layer, and the plating layer.

According to another exemplary embodiment, the internal electrodes may have the plurality of lead portions exposed in the length direction of the body.

Therefore, a distance between the external electrodes may be shortened, such that a current loop may also be shortened. Accordingly, ESL characteristics of the multilayer capacitor may be further decreased.

In addition, since the external electrodes are applied as a plurality of layers and may be relatively thick, thereby serving as a buffer, the occurrence rate of structural defects occurring in a process of manufacturing a multilayer ceramic capacitor (MLCC) may be decreased, and the resulting MLCC may be highly reliable, even though the product has been miniaturized.

Modified Example

Figure 6:
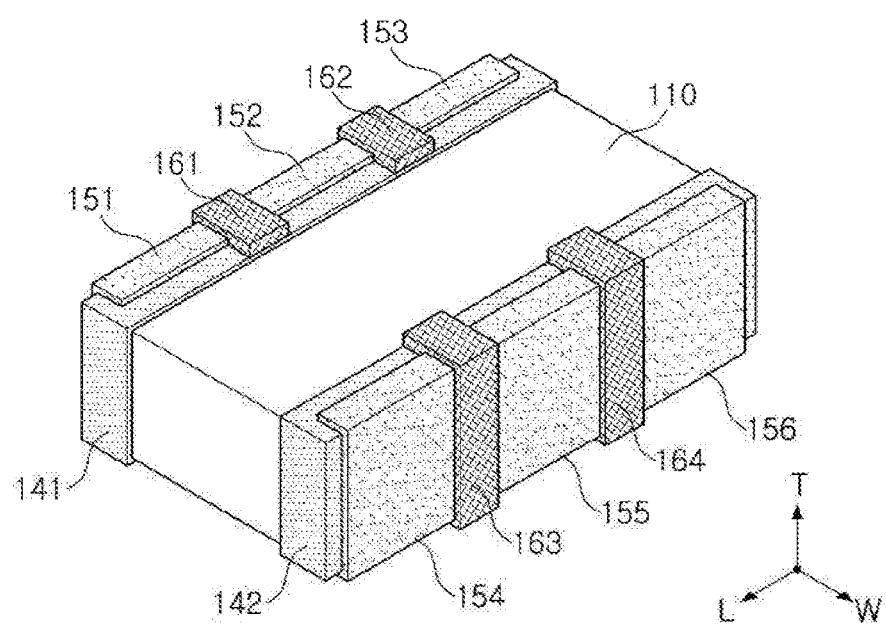
FIG. 6 is a perspective view schematically illustrating a multilayer capacitor, according to another exemplary embodiment in the present disclosure, excluding a plating layer.
Figure 7:
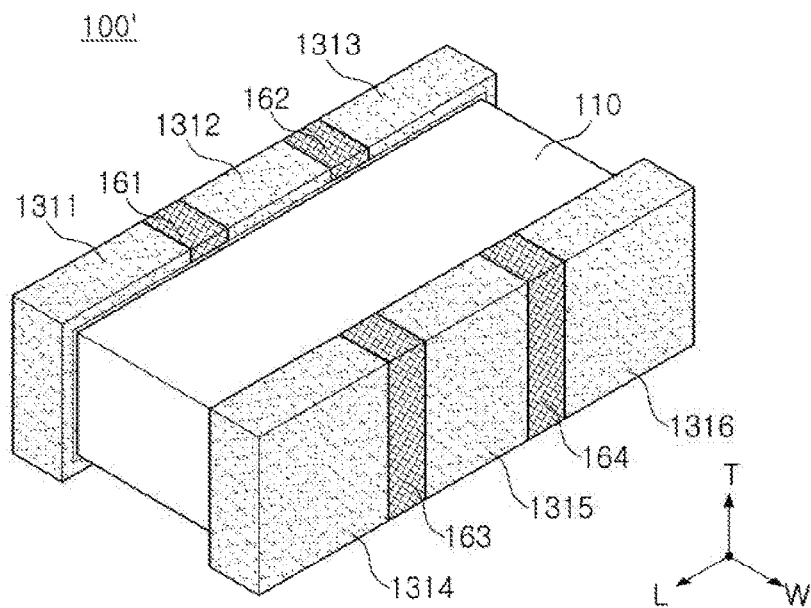
FIG. 7 is a perspective view illustrating a multilayer capacitor, according to another exemplary embodiment in the present disclosure.
Figure 8:
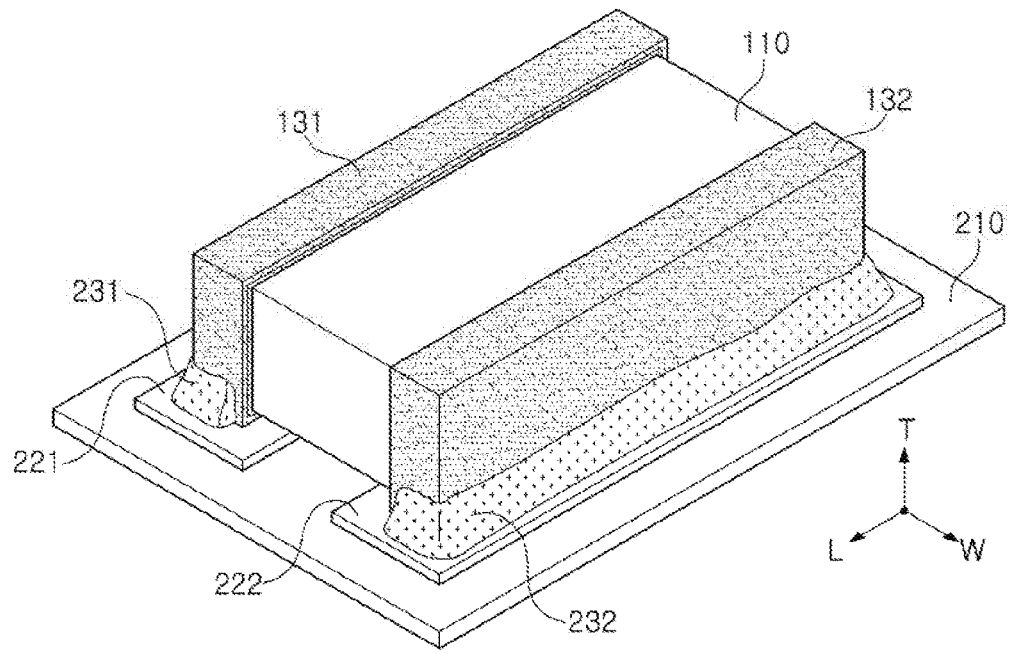
FIG. 8 is a perspective view schematically illustrating a board with a multilayer capacitor, according to an exemplary embodiment in the present disclosure.

FIG. 6 is a perspective view schematically illustrating a multilayer capacitor, according to another exemplary embodiment in the present disclosure, excluding a plating layer; and FIG. 7 is a perspective view illustrating a multilayer capacitor, according to another exemplary embodiment in the present disclosure.

Here, since the structures of first and second internal electrodes, a body, first and second conducting layers, and first and second conductive resin layers, are similar to those of the exemplary embodiment described above, a detailed description thereof will be omitted in order to avoid overlapping descriptions, and first and second plating layers, in addition to first and second polymer resin layers, having respective structures different than those of the exemplary embodiment described above, will be illustrated and described in detail.

Referring to FIGS. 6 and 7, in a multilayer capacitor 100', according to the present exemplary embodiment, first polymer resin layers 161 and 162 may be formed on a first conducting layer 141 to be disposed between a plurality of first conductive resin layers 151 to 153, and second polymer resin layers 163 and 164 may be formed on a second conducting layer 142 to be disposed between a plurality of second conductive resin layers 154 to 156, before first and second plating layers are formed.

In this case, when plating is performed on the first and second conducting layers 141 and 142, first plating layers 1311 to 1313 may be formed only on the respective first conductive resin layers 151 to 153, with the first polymer resin layers 161 and 162 interposed therebetween, and second plating layers 1314 to 1316 may be formed only on the respective second conductive resin layers 154 to 156, with the second polymer resin layers 163 and 164 interposed therebetween.

According to the present exemplary embodiment, since solders are not directly bonded to the first and second conducting layers 141 and 142 at the time of mounting the multilayer capacitor on a board, mechanical stress transferred from the solders may be absorbed by the elastic force of the first and second conductive resin layers 151 to 156, such that the mechanical strength of the multilayer capacitor 100 may be improved.

As set forth above, according to exemplary embodiments in the present disclosure, a multilayer capacitor having low equivalent series inductance (ESL) characteristics and a low occurrence rate of structural defects in a process of manufacturing a multilayer ceramic capacitor (MLCC) be implemented with a high degree of reliability.

While exemplary embodiments have been shown and described above, it will be apparent to those skilled in the art that modifications and variations could be made without departing from the scope of the present invention as defined by the appended claims.

What is claimed is:

1. A multilayer capacitor comprising:
a body including first and second internal electrodes alternately disposed with at least one dielectric layer interposed therebetween, the first internal electrodes having a plurality of first lead portions exposed to a first surface of the body, and the second internal electrodes having a plurality of second lead portions exposed to a second surface of the body opposing the first surface, wherein the plurality of first lead portions are spaced apart from each other and the plurality of second lead portions are spaced apart from each other; and
first and second external electrodes respectively disposed on the first and second surfaces of the body to which the first and second lead portions are exposed,
wherein the first external electrode includes a first conducting layer formed on the first surface of the body to cover the plurality of first lead portions, a plurality of first conductive resin layers formed on the first conducting layer to correspond to the first lead portions, respectively, and a first plating layer formed on the first conducting layer to cover the plurality of first conductive resin layers, and
the second external electrode includes a second conducting layer formed on the second surface of the body to cover the plurality of second lead portions, a plurality of second conductive resin layers formed on the second conducting layer to correspond to the second lead portions, respectively, and a second plating layer formed on the second conducting layer to cover the plurality of second conductive resin layers.

2. The multilayer capacitor of claim 1, wherein the first external electrode further includes first polymer resin layers disposed between the plurality of first lead portions on the first conducting layer, and the second external electrode further includes second polymer resin layers disposed between the plurality of second lead portions on the second conducting layer.

3. The multilayer capacitor of claim 2, wherein the first plating layers are formed on the respective first conductive resin layers, with the first polymer resin layers interposed therebetween, and the second plating layers are formed on the respective second conductive resin layers, with the second polymer resin layers interposed therebetween.

4. The multilayer capacitor of claim 1, wherein the first and second lead portions are respectively exposed to first and second surfaces of the body in a width direction.

5. The multilayer capacitor of claim 1, wherein the first and second lead portions are respectively exposed to first and second surfaces of the body in a length direction.

6. The multilayer capacitor of claim 1, wherein the first and second conducting layers each extend onto a portion of a surface of the body in a thickness direction.

7. The multilayer capacitor of claim 6, wherein the first and second conductive resin layers each extend to the extended portions of the first and second conducting layers.

8. The multilayer capacitor of claim 7, wherein the first and second plating layers each extend to cover the extended portions of the first and second conducting layers and to cover the extended portions of the first and second conductive resin layers.

9. The multilayer capacitor of claim 1, wherein the first conductive resin layers contain a thermosetting resin and a metal.

10. The multilayer capacitor of claim 1, wherein the second conductive resin layers contain a thermosetting resin and a metal.

11. Aboard having a multilayer capacitor, comprising:
a substrate, having first and second electrode pads disposed on an upper surface thereof; and
the multilayer capacitor of claim 1, of which the first and second plating layers are mounted on the first and second electrode pads.

* * * * *